(12) United States Patent
Zhou et al.

(10) Patent No.: US 11,226,443 B2
(45) Date of Patent: Jan. 18, 2022

(54) PIEZOELECTRIC COLOR FILTER, PIEZOELECTRIC COLOR FILTER SUBSTRATE, DISPLAY DEVICE, AND PRODUCTION METHOD

(71) Applicant: BOE TECHNOLOGY GROUP CO., LTD., Beijing (CN)

(72) Inventors: Qingchao Zhou, Beijing (CN); Shengji Yang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 311 days.

(21) Appl. No.: 16/415,738

(22) Filed: May 17, 2019

(65) Prior Publication Data

US 2020/0018877 A1 Jan. 16, 2020

(30) Foreign Application Priority Data

Jul. 13, 2018 (CN) .......................... 201810772329.8

(51) Int. Cl.
*G02B 5/22* (2006.01)
*G02B 1/04* (2006.01)
(Continued)

(52) U.S. Cl.
CPC ............... *G02B 5/223* (2013.01); *G02B 1/04* (2013.01); *G02F 1/23* (2013.01); *G06F 3/0412* (2013.01); *G06F 3/04144* (2019.05); *G09G 3/3413* (2013.01); *H01L 41/0471* (2013.01); *H01L 41/1132* (2013.01); *H01L 41/18* (2013.01); *H01L 41/253* (2013.01); *G02F 1/133516* (2013.01); *G02F 2202/36* (2013.01); *G06F 2203/04103* (2013.01); *G09G 2300/0452* (2013.01); *G09G 2354/00* (2013.01)

(58) Field of Classification Search
CPC .......... G02B 5/223; G02B 1/04; G02B 5/201; G09G 3/3413; G09G 2300/0452; G09G 2354/00; G06F 3/04144; G06F 3/0412; G06F 2203/04103; G06F 3/0414; G02F 1/23; G02F 2202/36; G02F 1/133516; G02F 1/133394; G02F 1/133617; G02F 1/13338; H01L 41/0471; H01L 41/1132; H01L 41/18; H01L 41/253; H01L 41/047; C09K 11/08
See application file for complete search history.

(56) References Cited

U.S. PATENT DOCUMENTS

2016/0062463 A1\* 3/2016 Liu ........................ G06F 3/0414
345/173
2016/0088756 A1\* 3/2016 Ramadas ............ H01L 51/5259
361/728
(Continued)

*Primary Examiner* — Cara E Rakowski
(74) *Attorney, Agent, or Firm* — McDermott Will & Emery LLP

(57) ABSTRACT

Provided is a piezoelectric color filter, wherein the piezoelectric color filter has piezoelectricity and comprises a photoluminescent material. The piezoelectric color filter may have a matrix of a first piezoelectric material being transparent or translucent; and quantum dots distributed in the matrix of the first piezoelectric material. Also provided are a piezoelectric color filter substrate, a display device, and a production method of the piezoelectric color filter.

15 Claims, 3 Drawing Sheets

(51) Int. Cl.
*G02F 1/23* (2006.01)
*G06F 3/041* (2006.01)
*H01L 41/047* (2006.01)
*H01L 41/113* (2006.01)
*H01L 41/18* (2006.01)
*H01L 41/253* (2013.01)
*G09G 3/34* (2006.01)
*G02F 1/1335* (2006.01)

(56) References Cited

U.S. PATENT DOCUMENTS

2018/0298278 A1* 10/2018 Zhong .................... H01L 51/502
2018/0307075 A1* 10/2018 Jeong ................ G02F 1/133617
2019/0113977 A1* 4/2019 Kim ........................ G06F 3/041

* cited by examiner

PIEZOELECTRIC COLOR FILTER, PIEZOELECTRIC COLOR FILTER SUBSTRATE, DISPLAY DEVICE, AND PRODUCTION METHOD

CROSS-REFERENCE TO RELATED APPLICATION

This disclosure claims the priority of Chinese Patent Application No. 201810772329.8 filed on Jul. 13, 2018, which is incorporated herein in its entirety by reference.

TECHNICAL FIELD

This disclosure relates to the field of touch control display technology, in particular, to a piezoelectric color filter, a piezoelectric color filter substrate, a display device, and a production method of a piezoelectric color filter.

BACKGROUND ART

Touch control technology is used in electric devices having the function of touch control display, such as a television, a tablet computer, a laptop, a cell phone, a navigator, or the like. The touch control technology is achieved by a touch control panel.

Touch control panels are generally classified into touch control panels of resistance, touch control panels of capacitance, optical touch control panels, touch control panels of sound wave, and the like. In a process for achieving touch control and display in a touch control display electric device, a touch control display assembly is formed by stacking a touch control panel and a display panel. For example, in some types of electric devices, the piezoelectric layer in the touch control panel is stacked on the color filter substrate of the display panel of the electric device. This kind of touch control display electric devices is hard to be thinned.

There is a need to further thin the touch control display electric devices.

SUMMARY

In one aspect, this disclosure provides a piezoelectric color filter, wherein the piezoelectric color filter has piezoelectricity and comprises a photoluminescent material.

Optionally, the piezoelectric color filter comprises:
a matrix of a first piezoelectric material being transparent or translucent; and
quantum dots distributed in the matrix of the first piezoelectric material.

Optionally, the first piezoelectric material is polyvinylidene fluoride.

Optionally, the quantum dots are perovskite quantum dots.

Optionally, the perovskite quantum dot has a particle size of 3 to 5 nm.

Optionally, the piezoelectric color filter further comprises:
a second piezoelectric material distributed in the matrix of the first piezoelectric material, wherein the second piezoelectric material has a piezoelectric coefficient larger than that of the first piezoelectric material.

Optionally, the piezoelectric color filter has a thickness of 2 µm or more.

In another aspect, this disclosure provides a piezoelectric color filter substrate, comprising:
a first transparent piezoelectricity-sensing electrode layer;
a second transparent piezoelectricity-sensing electrode layer; and
one or more piezoelectric color filters mentioned above between the first transparent piezoelectricity-sensing electrode layer and the second transparent piezoelectricity-sensing electrode layer.

In still another aspect, this disclosure provides a display device, comprising:
a light source; and
the piezoelectric color filter substrate mentioned above on the light source.

Optionally, the first transparent piezoelectricity-sensing electrode layer is a one-piece electrode sheet, and the second transparent piezoelectricity-sensing electrode layer comprises a plurality of separated electrode sheets;
the display device further comprises a touch control processing unit, being connected electrically to the one-piece electrode sheet and the plurality of separated electrode sheets respectively, for generating a touch control signal on the basis of sensing electric signals between each of the separated electrode sheets and the one-piece electrode sheet.

Optionally, the piezoelectric color filter comprises:
a matrix of a first piezoelectric material being transparent or translucent; and
quantum dots distributed in the matrix of the first piezoelectric material.

Optionally, the first piezoelectric material is polyvinylidene fluoride.

Optionally, the quantum dots are perovskite quantum dots.

Optionally, the perovskite quantum dot has a particle size of 3 to 5 nm.

Optionally, the piezoelectric color filter further comprises:
a second piezoelectric material distributed in the matrix of the first piezoelectric material, wherein the second piezoelectric material has a piezoelectric coefficient larger than that of the first piezoelectric material.

Optionally, the piezoelectric color filter has a thickness of 2 µm or more.

Optionally, the light source is a blue light source;
the piezoelectric color filter substrate comprises a red color filter for converting a blue light to a red light and a green color filter for converting a blue light to a green light.

In yet another aspect, this disclosure provides a production method for the above piezoelectric color filter, comprising:
mixing the first piezoelectric material, the quantum dots and a solvent, to form a piezoelectric color filter liquid;
coating and drying the piezoelectric color filter liquid, to form a piezoelectric color filter.

Optionally, the first piezoelectric material is polyvinylidene fluoride and the solvent is a polar organic solvent.

EMBODIMENTS

Figure 1:
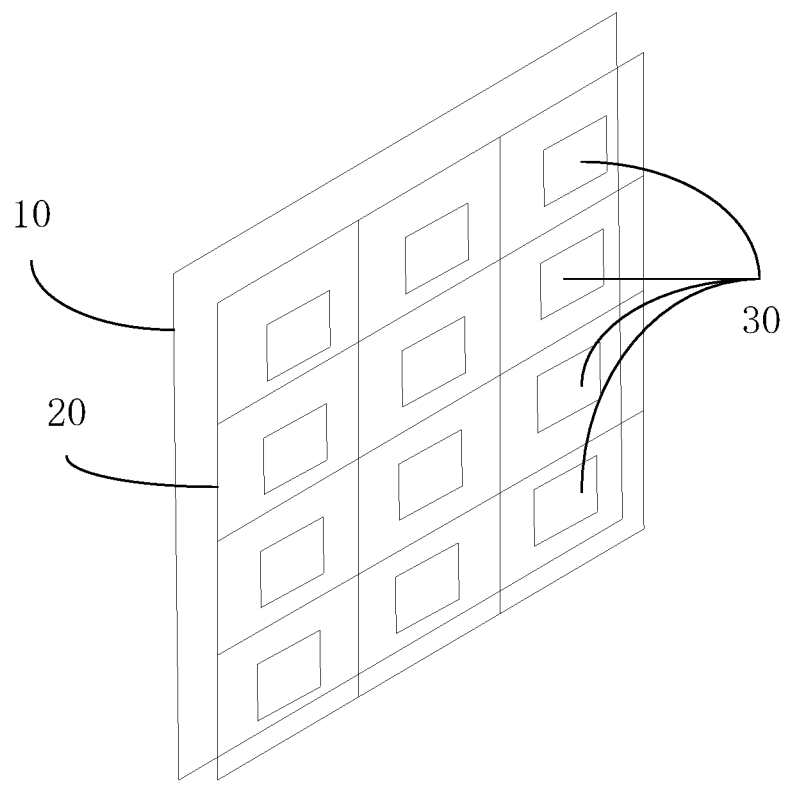
FIG. 1 is a schematic drawing of the structure of a piezoelectric color filter substrate provided in this disclosure.

This disclosure provides a piezoelectric color filter, wherein the piezoelectric color filter changes a color of a light transmitted through the piezoelectric color filter and has piezoelectricity. The piezoelectric color filter of this disclosure, similar to a conventional color filter, is capable of changing the color of the light transmitted through the piezoelectric color filter. The piezoelectric color filter is used in front of a light source (such as a backlight source), to convert the light of the light source into a desired color. The piezoelectric color filter of this disclosure comprises a photoluminescent material, and converts the light of the light source into a desired color by the photoluminescent material. The piezoelectric color filter of this disclosure also has piezoelectricity. Therefore, it may be used in the touch control structure in a touch control display device, so that the whole thickness of the touch control display device may be reduced.

Optionally, the piezoelectric color filter changes a color of a light transmitted through the piezoelectric color filter by photoluminescence of quantum dot as the photoluminescent material. The color of quantum dot photoluminescence may be adjusted by adjusting the type and particle size of the quantum dot.

Optionally, the piezoelectric color filter comprises:
a matrix of a first piezoelectric material being transparent or translucent; and
quantum dots as the photoluminescent material distributed in the matrix of the first piezoelectric material.

That is, the matrix of the first piezoelectric material provides piezoelectricity, and the quantum dots distributed in the matrix of the first piezoelectric material provides photoluminescence.

Optionally, the first piezoelectric material is polyvinylidene fluoride. Optionally, the quantum dots are perovskite quantum dots. Piezoelectric color filters having good piezoelectricity and photoluminescence may be formed conveniently and efficiently by using these materials. Optionally, the perovskite quantum dot has a particle size of 3 to 5 nm. In this range, the effect of converting light is excellent.

Optionally, the piezoelectric color filter further comprises: a second piezoelectric material distributed in the matrix of the first piezoelectric material, wherein the second piezoelectric material has a piezoelectric coefficient larger than that of the first piezoelectric material. The piezoelectricity of the piezoelectric color filter may be further improved by adding a second piezoelectric material having a larger piezoelectric coefficient, and meanwhile, the thickness and the ability of changing the color of the light are not influenced.

Optionally, the piezoelectric color filter has a thickness of 2 μm or more. Such a thickness may ensure conduction will not occur between the two sides of the piezoelectric color filter due to the contact of the quantum dots to each other therein.

This disclosure also provides a piezoelectric color filter substrate, comprising:
a first transparent piezoelectricity-sensing electrode layer;
a second transparent piezoelectricity-sensing electrode layer; and
one or more piezoelectric color filters of this disclosure between the first transparent piezoelectricity-sensing electrode layer and the second transparent piezoelectricity-sensing electrode layer.

Multiple piezoelectric color filters may allow the color of the light to be different at different positions of the color filter substrate. For example, pixels having different colors may be formed.

This disclosure also provides a display device, comprising a light source; and the piezoelectric color filter substrate of this disclosure on the light source.

The display device may be a touch control display device. In one embodiment, the first transparent piezoelectricity-sensing electrode layer is a structure in a plane form, and the second transparent piezoelectricity-sensing electrode layer comprises a plurality of second sub-electrodes separated from each other; the display device further comprises a touch control processing unit, being connected electrically to the structure in a plane form and the plurality of second sub-electrodes separated from each other respectively, for generating a touch control signal on the basis of sensing electric signals between each of the second sub-electrodes separated from each other and the first transparent piezoelectricity-sensing electrode layer.

The structure and material of the piezoelectric color filter may be those described above.

Optionally, the light source is a blue light source; the piezoelectric color filter substrate comprises a red color filter for converting a blue light to a red light and a green color filter for converting a blue light to a green light. In this case, the display device may also comprise a transparent piezoelectric layer that does not change the color of the light in blue display regions.

The production method of the color filter substrate proposed in this disclosure comprises following steps:
producing a first transparent piezoelectricity-sensing electrode layer;
producing at least a first piezoelectric material allowing the light passing through into a piezoelectric region of a color filter layer, at an electric signal-sensing side of the first transparent piezoelectricity-sensing electrode layer, wherein a first side of the piezoelectric region of the color filter layer faces an electric signal-sensing side of the first transparent piezoelectricity-sensing electrode layer;
producing a second transparent piezoelectricity-sensing electrode layer at a second side of the piezoelectric region of the color filter layer, wherein the second side of the color filter layer is the opposite side of the color filter layer.

The color filter layer comprises a piezoelectric region made of at least a first piezoelectric material allowing the light passing through. The first transparent piezoelectricity-sensing electrode layer is provided at the first side of the piezoelectric region of the color filter layer. The second transparent piezoelectricity-sensing electrode layer is provided at the second side of the piezoelectric region of the color filter layer. When the piezoelectric region of the color filter layer is subjected to a pressure, a voltage is generated. The first transparent piezoelectricity-sensing electrode layer and the second transparent piezoelectricity-sensing electrode layer may sense the voltage, so as to achieve the function of touch control. With respect to the related art, it is unnecessary to provide a separated piezoelectric material layer. When it is used in a display device, the thickness of the display device may be reduced.

The process of making the piezoelectric region of the color filter layer of the first piezoelectric material may be in a physical pressing manner. Other possible manners to obtain it may also be used. For example, the step of producing at least a first piezoelectric material allowing the light passing through into a piezoelectric region of a color filter layer comprising:
producing a color filter liquid from at least the first piezoelectric material and a solvent, arranging the color filter liquid on a substrate, drying it to form a color filter layer, wherein the first piezoelectric material is soluble in the solvent. The process of arranging the color filter liquid may be printing processes. The first piezoelectric material may comprise polyvinylidene fluoride. Polyvinylidene fluoride has a white and translucent appearance. The substrate may be a glass substrate. For the production of the color filter layer having quantum dots, the specific method may comprise:

producing color filter liquids having different colors from at least the first piezoelectric material and a solvent and perovskite quantum dots having different colors, arranging the color filter liquids having different colors on a substrate, drying them to form pixels having different colors in a color filter layer. The addition of the perovskite quantum dots may improve the piezoelectric effect of the polyvinylidene fluoride and achieve better piezoelectric touch control effect, in addition to acting as a light conversion material.

For a color filter layer having quantum dot pixels of three colors, the specific method may comprise:

producing a color filter liquid having a first color from at least polyvinylidene fluoride and a solvent and perovskite quantum dot having the first color;

producing a color filter liquid having a second color from at least polyvinylidene fluoride and a solvent and perovskite quantum dot having the second color;

producing a color filter liquid having a third color from at least polyvinylidene fluoride and a solvent and perovskite quantum dot having the third color;

arranging the color filter liquid having the first color, the color filter liquid having the second color, and the color filter liquid having the third color on a substrate, drying them to form three kinds of pixels of the color filter layer. The first color, the second color and the third color may correspond to red, green and blue in this order.

For a color filter layer having quantum dot pixels of two colors, the specific method may comprise:

producing a color filter liquid having a first color from at least polyvinylidene fluoride and a solvent and perovskite quantum dot having the first color;

producing a color filter liquid having a second color from at least polyvinylidene fluoride and a solvent and perovskite quantum dot having the second color;

producing a color filter liquid without color from at least polyvinylidene fluoride and a solvent;

arranging the color filter liquid having the first color, the color filter liquid having the second color, and the color filter liquid without color on a substrate, drying them to form three kinds of pixels of the color filter layer. The first color and the second color may be any two of red, green and blue.

The perovskite quantum dot has high photoluminescence efficiency. The solvent may be a polar organic solvent. The polar organic solvent, polyvinylidene fluoride and perovskite quantum dots are used to produce high efficiently luminescent perovskite quantum dots of small particle in the polyvinylidene fluoride matrix. The particle size of the perovskite quantum dot is 3 to 5 nm.

Further, on the basis of the examples mentioned above, a second piezoelectric material is added, so that the piezoelectric effect in the piezoelectric region of the color filter layer may be further improved, and the final effect of piezoelectric touch control may be improved. The producing a color filter liquid from at least the first piezoelectric material and a solvent specifically comprises:

producing a color filter liquid from at least the first piezoelectric material, powders of a second piezoelectric material and a solvent, wherein the second piezoelectric material has a piezoelectric coefficient larger than that of the first piezoelectric material. For example, the second piezoelectric material may be lead zirconate titanate piezoelectric ceramic, but is not limited to this. The particle size of the powder of the second piezoelectric material may be less than 200 micrometers. The second piezoelectric material may be insoluble in the solvent. The second piezoelectric material may have better piezoelectricity than the first piezoelectric material, but may be poor in some other aspects, such as mechanical properties, optical properties, processability, or the like.

In a color filter substrate provided in this disclosure, the color filter layer comprises a piezoelectric region made of at least a first piezoelectric material allowing the light passing through, wherein a first transparent piezoelectricity-sensing electrode layer is provided at a first side of the piezoelectric region, and a second transparent piezoelectricity-sensing electrode layer is provided at a second side of the piezoelectric region, to achieve the touch control function of the color filter substrate.

FIG. 1 is an example of a color filter substrate provided in this disclosure. See FIG. 1. The color filter substrate provided in this disclosure comprises a color filter layer 10, a first transparent piezoelectricity-sensing electrode layer 20, and a second transparent piezoelectricity-sensing electrode layer 30.

The color filter layer 20 comprises: a piezoelectric region made of at least a first piezoelectric material allowing the light passing through; a first transparent piezoelectricity-sensing electrode layer 10 provided at a first side of the piezoelectric region of the color filter layer 20; and a second transparent piezoelectricity-sensing electrode layer 30 provided at a second side of the piezoelectric region of the color filter layer 20; wherein the second side of the color filter layer 20 is the opposite side of the first side of the color filter layer 20.

The color filter layer comprises a piezoelectric region made of at least a first piezoelectric material allowing the light passing through. The first transparent piezoelectricity-sensing electrode layer is provided at the first side of the piezoelectric region. The second transparent piezoelectricity-sensing electrode layer is provided at the second side of the piezoelectric region. When the piezoelectric region of the color filter layer is subjected to a pressure, a voltage is generated. The first transparent piezoelectricity-sensing electrode layer and the second transparent piezoelectricity-sensing electrode layer may sense the voltage, so as to achieve the function of touch control. With respect to the related art, it is unnecessary to provide a separated piezoelectric material layer. When it is used in a display device, the thickness of the display device may be reduced.

Figure 2:
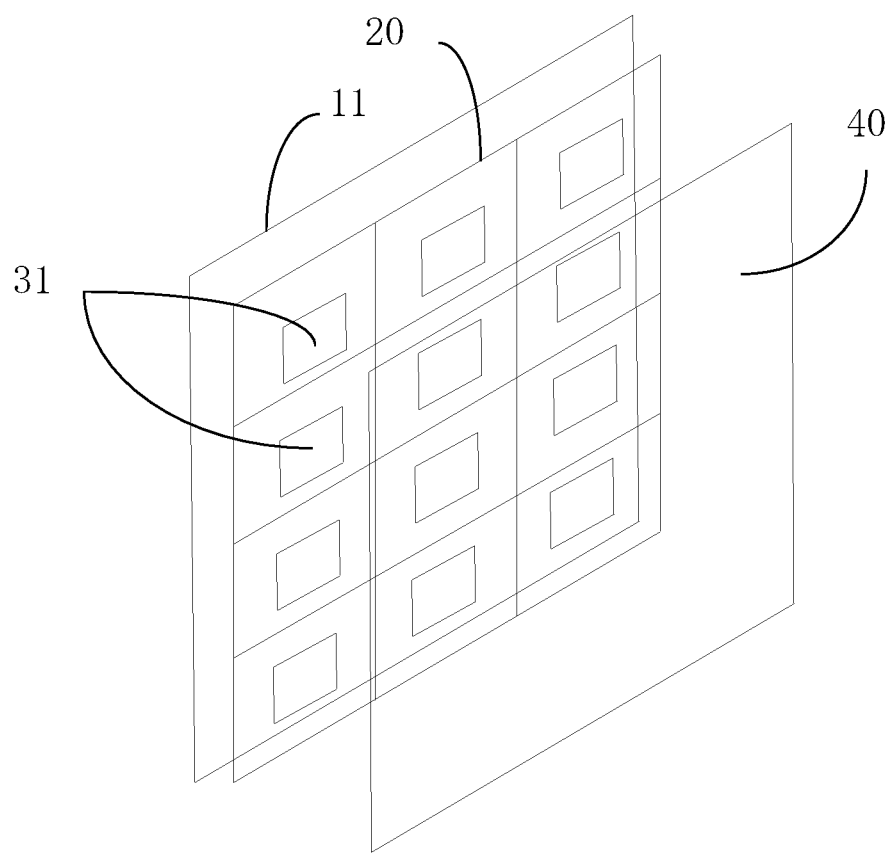
FIG. 2 is a schematic drawing of the structure of a specific piezoelectric color filter substrate provided in this disclosure.

The first transparent piezoelectricity-sensing electrode layer may be a structure in a plane form. The structure in a plane form may be produced of indium tin oxide (ITO). The piezoelectric region of the color filter layer is produced at one side of the structure in a plane form. The second transparent piezoelectricity-sensing electrode layer comprises second sub-electrodes separated from each other distributed at different positions at the second side of the piezoelectric region of the color filter layer. The second sub-electrodes separated from each other may be produced of indium tin oxide (ITO). The multiple second sub-electrodes separated from each other face different areas of the structure in a plane form, respectively. Here, the piezoelectric region may be a part region or the whole region of the color filter layer. As shown in FIG. 2, a transparent cover plate 40 is also comprised. The transparent cover plate 40, the multiple second sub-electrodes separated from each other 31, the color filter layer 20, the structure in a plane form 11 are stacked in this order. Each of the second sub-electrodes separated from each other may correspond to each pixel in the color filter layer, but are not limited to this.

It may be understood that the more the number of the second sub-electrodes separated from each other is, the higher the sensibility of touch control is.

Further, the first piezoelectric material comprises polyvinylidene fluoride. Perovskite quantum dots are comprised in the piezoelectric region. The addition of the perovskite quantum dots may improve the piezoelectric effect of the polyvinylidene fluoride and achieve better piezoelectric touch control effect, in addition to acting as a light conversion material. The polyvinylidene fluoride generates potential for achieving identification of the site of touch control, in addition to acting as a transparent matrix for the perovskite quantum dots.

Another example of this disclosure provides a color filter substrate. It is different from the example mentioned above that the color filter layer comprises a piezoelectric region made of at least the first piezoelectric material and the second piezoelectric material, wherein the second piezoelectric material has a piezoelectric coefficient larger than that of the first piezoelectric material. The second piezoelectric material is comprised in the piezoelectric region. For example, the second piezoelectric material may be lead zirconate titanate piezoelectric ceramic, but is not limited to this. The particle size of the powder of the second piezoelectric material may be less than 200 micrometers. The piezoelectric effect in the piezoelectric region of the color filter layer may be further improved, and the final effect of piezoelectric touch control may be improved.

Figure 3:
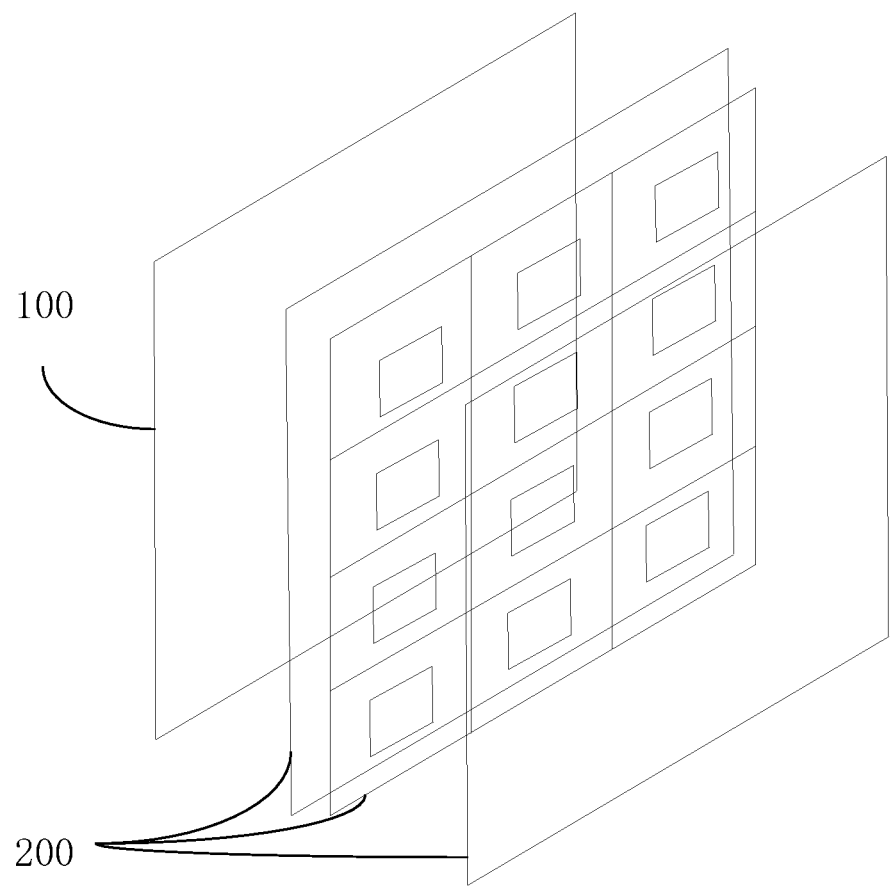
FIG. 3 is a schematic drawing of the structure of a display device provided in this disclosure.

FIG. 3 is an example of the display device provided in this disclosure. See FIG. 3, the display device provided in this disclosure comprises a backlight layer 100 and a color filter substrate 200. The color filter substrate 200 comprises a color filter layer, a first transparent piezoelectricity-sensing electrode layer, and a second transparent piezoelectricity-sensing electrode layer. The color filter substrate 200 is stacked on the light-emitting side of the backlight layer 100.

The display device may be any product or member having the function of display, such as a cell phone, a tablet computer, a television, a display, a laptop, a digital photo frame, a navigator, etc.

With respect to the related art, in the examples provided in this disclosure, piezoelectric function may be achieved in a color filter substrate without having to provide a separated piezoelectric material layer in the display device, so that the thickness of the display device may be reduced.

In a specific embodiment, the first transparent piezoelectricity-sensing electrode layer is a structure in a plane form. The second transparent piezoelectricity-sensing electrode layer comprises second sub-electrodes separated from each other distributed at different positions at the second side of the piezoelectric region of the color filter layer. A touch control processing unit is connected electrically to the structure in a plane form and the plurality of second sub-electrodes separated from each other respectively, for generating a touch control signal on the basis of sensing electric signals between each of the second sub-electrodes separated from each other and the first transparent piezoelectricity-sensing electrode layer. In some examples, the first transparent piezoelectricity-sensing electrode layer faces the light-emitting side of the backlight layer. In some other examples, the second transparent piezoelectricity-sensing electrode layer faces the light-emitting side of the backlight layer.

Here, the backlight layer may be a blue backlight layer. The piezoelectric region comprises a blue pixel area made of polyvinylidene fluoride, a red pixel area made of polyvinylidene fluoride and red quantum dots, and a green pixel area made of polyvinylidene fluoride and green quantum dots. The first transparent piezoelectricity-sensing electrode layer and the second transparent piezoelectricity-sensing electrode layer are located at the both sides of the color filter substrate, and collect the pulsed piezoelectric signal generated from the color filter substrate. The red and green perovskite quantum dot material blended in the color filter substrate absorb the blue light and convert it into corresponding red and green light, respectively. Complete absorption and conversion of blue light may be achieved by controlling the doping concentration. The blue pixel area without blended quantum dots allows the blue light passing directly.

The examples described above are merely some examples of this disclosure, and do not limit this disclosure in any manner. Any simple changing, equivalent alternating and modifying made to the examples mentioned above according to the substantive technology of this disclosure belongs to the range of technical solutions of this disclosure.

What is claimed is:

1. A piezoelectric color filter, wherein the piezoelectric color filter has piezoelectricity and comprises a photoluminescent material,
    wherein the piezoelectric color filter comprises:
    a matrix of a first piezoelectric material being transparent or translucent;
    quantum dots distributed in the matrix of the first piezoelectric material; and
    a second piezoelectric material distributed in the matrix of the first piezoelectric material, wherein the second piezoelectric material has a piezoelectric coefficient larger than that of the first piezoelectric material.

2. The piezoelectric color filter according to claim 1, wherein the first piezoelectric material is polyvinylidene fluoride.

3. The piezoelectric color filter according to claim 1, wherein the quantum dots are perovskite quantum dots.

4. The piezoelectric color filter according to claim 3, wherein the perovskite quantum dot has a particle size of 3 to 5 nm.

5. The piezoelectric color filter according to claim 1, wherein the piezoelectric color filter has a thickness of 2 μm or more.

6. A piezoelectric color filter substrate, comprising:
    a first transparent piezoelectricity-sensing electrode layer;
    a second transparent piezoelectricity-sensing electrode layer; and
    one or more piezoelectric color filters according to claim 1 between the first transparent piezoelectricity-sensing electrode layer and the second transparent piezoelectricity-sensing electrode layer.

7. A display device, comprising:
    a light source; and
    the piezoelectric color filter substrate according to claim 6 on the light source.

8. The display device according to claim 7, wherein
    the first transparent piezoelectricity-sensing electrode layer is a structure in a plane form, and the second transparent piezoelectricity-sensing electrode layer comprises a plurality of second sub-electrodes separated from each other;
    the display device further comprises a touch control processing unit, being connected electrically to the structure in a plane form and the plurality of second sub-electrodes separated from each other respectively, for generating a touch control signal on the basis of sensing electric signals between each of the second sub-electrodes separated from each other and the first transparent piezoelectricity-sensing electrode layer.

9. The display device according to claim 7, wherein the first piezoelectric material is polyvinylidene fluoride.

10. The display device according to claim 7, wherein the quantum dots are perovskite quantum dots.

11. The display device according to claim 10, wherein the perovskite quantum dot has a particle size of 3 to 5 nm.

12. The display device according to claim 7, wherein the piezoelectric color filter has a thickness of 2 μm or more.

13. The display device according to claim 7, wherein
the light source is a blue light source;
the piezoelectric color filter substrate comprises a red color filter for converting a blue light to a red light and a green color filter for converting a blue light to a green light.

14. A production method for the piezoelectric color filter according to claim 1, comprising:
mixing the first piezoelectric material, powders of the second piezoelectric material, the quantum dots and a solvent, to form a piezoelectric color filter liquid; and
coating and drying the piezoelectric color filter liquid, to form a piezoelectric color filter.

15. The production method according to claim 14, wherein the first piezoelectric material is polyvinylidene fluoride and the solvent is a polar organic solvent.

* * * * *